(12) United States Patent
Murray et al.

(10) Patent No.: US 7,140,066 B1
(45) Date of Patent: Nov. 28, 2006

(54) APPARATUS AND METHOD FOR INSPECTING AND CLEANING SEMICONDUCTOR DEVICES

(75) Inventors: Timothy Gray Murray, Hardy, VA (US); Bruce Alan Maass, Ferrum, VA (US)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 618 days.

(21) Appl. No.: 10/404,342

(22) Filed: Apr. 1, 2003

(51) Int. Cl.
*A47L 5/38* (2006.01)

(52) U.S. Cl. .................. 15/303; 15/300.1; 15/320; 15/327.1; 15/345; 134/137; 134/149; 134/157; 134/902; 156/345.51; 156/345.54; 156/345.55

(58) Field of Classification Search ............. 134/137, 134/149, 157, 201, 902; 15/300.1, 303, 320, 15/327.1, 345; 156/345.51, 345.54, 345.55
See application file for complete search history.

(56) References Cited

U.S. PATENT DOCUMENTS

| | | | | | |
|---|---|---|---|---|---|
| 5,806,138 | A | * | 9/1998 | Kawasaki | ............ 15/303 |
| 5,967,156 | A | * | 10/1999 | Rose et al. | ............ 134/7 |
| 6,767,429 | B1 | * | 7/2004 | Amano | ...... 156/345.29 |

FOREIGN PATENT DOCUMENTS

JP        5-104431      *    4/1993

* cited by examiner

*Primary Examiner*—M. Kornakov
(74) *Attorney, Agent, or Firm*—RatnerPrestia

(57) ABSTRACT

A semiconductor device is inspected and cleaned by applying a vacuum to the area in which the semiconductor device is positioned. Micro-sized particulates that are brushed off the semiconductor device during cleaning are drawn off by the vacuum.

5 Claims, 2 Drawing Sheets

APPARATUS AND METHOD FOR INSPECTING AND CLEANING SEMICONDUCTOR DEVICES

FIELD OF THE INVENTION

The present invention relates, in general, to the inspection and cleaning of components and, in particular, to the inspection of semiconductor devices and the removal of micro-sized particulates from such semiconductor devices and the disposal of such micro-sized particulates.

BACKGROUND OF THE INVENTION

At the present time, certain semiconductor devices, such as silicon microchips, filmed micro-channel plates, and other similar wafer devices, are inspected and cleaned of micro-sized particulates in "clean-room" environments. It has been found that, even in such an environment that is thought to be ideal for cleaning such devices, particulates that are to be cleaned continue to contaminate the device to an unacceptable extent. When, for example, an operator brushes contamination particulates from a glass wafer, the contamination particulates can become airborne or temporarily attached to the brush being used to clean the device. The particulates can then settle again on the device or be drawn from the brush to the device by static charge.

SUMMARY OF THE INVENTION

In accordance with the present invention, semiconductor devices are cleaned during the general inspection process by applying a vacuum to the area in which the semiconductor device is being held during inspection to draw off micro-sized particulates removed from the semiconductor device during cleaning of the semiconductor device.

DETAILED DESCRIPTION OF THE INVENTION

Figure 1:
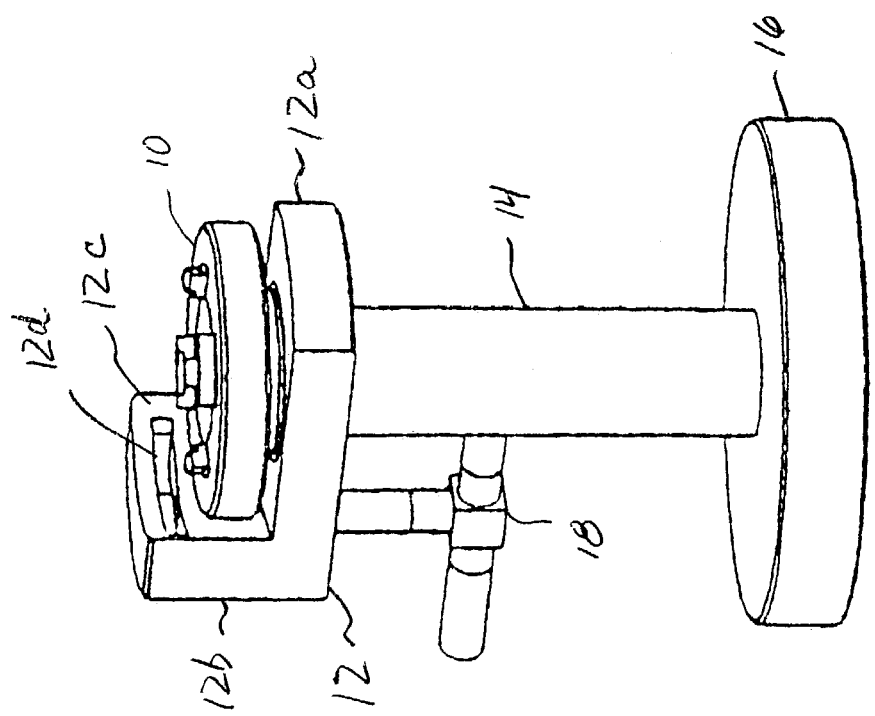
FIG. 1 is a perspective view of inspection apparatus constructed in accordance with the present invention.
Figure 3:
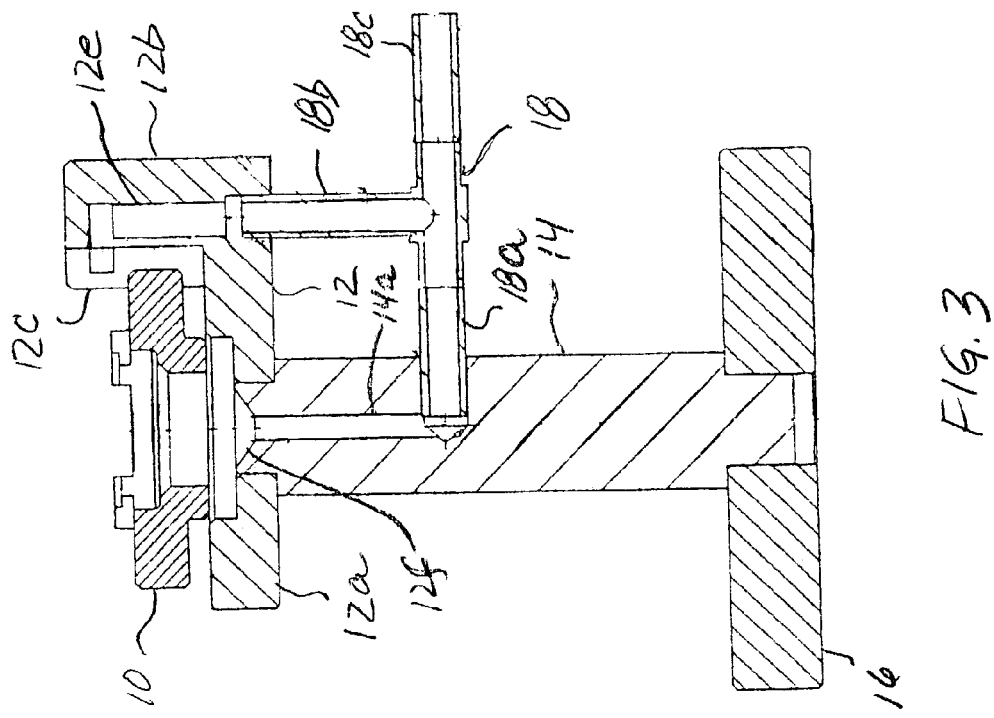
FIG. 3 is a vertical sectional view of the inspection apparatus of FIGS. 1 and 2 taken along line 3—3 of FIG. 2.
Figure 2:
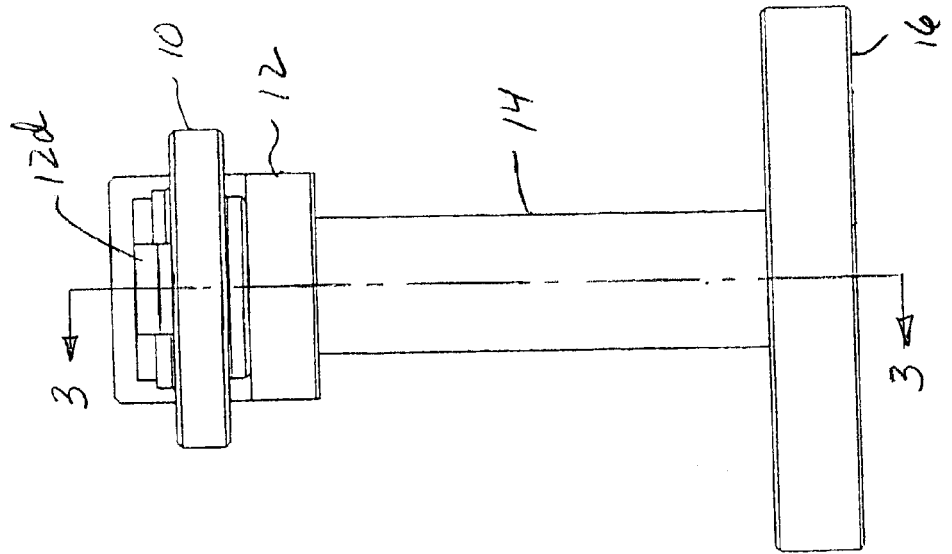
FIG. 2 is a side view of the FIG. 1 inspection apparatus.

Referring to FIGS. 1, 2, and 3, inspection and cleaning apparatus for semiconductor devices, constructed in accordance with the present invention, includes means for holding a semiconductor device, such as a silicon microchip, a filmed micro-channel plate, and other similar wafer devices, that is being inspected. For the embodiment of the present invention illustrated by the drawings and being described, a semiconductor device is held in a dish 10. Dish 10 is mounted for horizontal rotational movement.

Inspection and cleaning apparatus for semiconductor devices, constructed in accordance with the present invention, also includes means for applying a vacuum to the area in which the semiconductor device is being held to draw off micro-sized particulates removed from the semiconductor device. For the embodiment of the present invention illustrated by the drawings and being described, the means for applying a vacuum include a vacuum platform 12 having a first segment 12a extending beneath dish 10 and on which dish 10 is mounted and a second segment 12b having a curved surface 12c facing dish 10.

Surface 12c of vacuum platform 12 extends along an arc of a circle having a diameter greater than the diameter of dish 10 and has a horizontally extending elongated opening 12d. Opening 12d is an intake port that is above and horizontally adjacent dish 10 in which the semiconductor device being inspected is held. Segment 12b of vacuum platform 12 has a passage 12e extending to intake port 12d. Contamination particulates from the semiconductor device are drawn off through intake port 12d.

Selection of the radial angle of intake port 12d (i.e., the arc length of the intake port) is dependent on the overall design of the apparatus and the degree of the vacuum being applied. By way of example only, a radial angle of approximately 60° has produced good results.

Segment 12a of vacuum platform 12 has a second intake port 12f below dish 10. Contamination particulates from the semiconductor device also are drawn off through intake port 12f.

For the embodiment of the present invention illustrated by the drawings and being described, the inspection and cleaning apparatus includes a post 14 and a base 16. Post 14 supports vacuum platform 12 and has a passage 14a extending to intake port 12f in vacuum platform 12 and below dish 10.

Vacuum is applied to the area in which the semiconductor device is being held, namely to the vicinity of dish 10, through a T-fitting 18 having a first branch 18a connected to passage 14a in post 14, a second branch 18b connected to passage 12e in segment 12b of vacuum platform 12, and a third branch 18c adapted for connection to a vacuum source (not shown). Micro-sized particulates from the semiconductor device are drawn off through intake ports 12d and 12f by the vacuum applied through these two ports.

Typically, a semiconductor device is cleaned by an operator brushing micro-sized particulates from the semiconductor device. The vacuum applied through intake ports 12d and 12f facilitates removal of airborne particulates and particulates that cling to the brush. As already indicated, dish 10 is mounted for horizontal rotational movement. Thus, sectors of the semiconductor device can be moved past intake port 12d, so that removal of particulates is facilitated by brushing the semiconductor device in the vicinity of intake port 12d. Particulates that fall from a semiconductor device or become airborne as dish 10 is moved to and from its position on vacuum platform 12 or when the vacuum source is turned off also are drawn off through intake port 12f.

Although the invention is illustrated and described herein with reference to specific embodiments, the invention is not intended to be limited to the details shown. Rather, various modifications may be made in the details within the scope and range of equivalents of the claims and without departing from the invention.

What is claimed is:

1. Inspection and cleaning apparatus for semiconductor devices comprising:
    means for holding a semiconductor device that is being inspected; and
    means for applying a vacuum to the area in which the semiconductor device is being held to draw off micro-sized particulates removed from the semiconductor device;
    (a) said means for applying a vacuum includes an intake port above and horizontally adjacent said means for holding said semiconductor device, (b) said means for holding the semiconductor device is mounted for moving sectors of the semiconductor device past said intake port;

(c) said intake port being a horizontally extending elongated opening, and (d) said means for holding the semiconductor device being mounted for horizontal rotation to move said sectors of the semiconductor device past said intake port;

said means for applying a vacuum further including a second intake port below said means for holding said semiconductor device, a vacuum platform having (e) a first segment on which said means for holding the semiconductor device is mounted, said first segment extending beneath said means for holding the semiconductor device and having said second intake port, and (g) a second segment having said horizontally extending elongated opening.

2. Inspection and cleaning apparatus for semiconductor devices according to claim 1 further including a post that:

(a) supports said vacuum platform, and (b) has a passage extending to said second intake port.

3. Inspection and cleaning apparatus for semiconductor devices according to claim 2 wherein:

(a) said second segment of said vacuum platform has a passage extending to said horizontally extending elongated opening, and (b) said inspection apparatus further include a T-fitting having:

(1) a first branch connected to said passage in said post (2) a second branch connected to said passage in said second segment of said vacuum platform, and (3) a third branch adapted for connection to a vacuum source.

4. Inspection and cleaning apparatus for semiconductor devices according to claim 1 wherein:

(a) said means for holding the semiconductor device include a dish having a circular perimeter in which the semiconductor device is held, and (b) said second segment of said vacuum platform has a curved surface:

(1) facing said dish and extending along an arc of a circle having a diameter greater than the diameter of said dish, and (2) having said horizontally extending elongated opening.

5. Inspection and cleaning apparatus for semiconductor devices according to claim 3 wherein:

(a) said means for holding the semiconductor device include a dish having a circular perimeter in which the semiconductor device is held, and (b) said second segment of said vacuum platform has a curved surface:

(1) facing said dish and extending along an arc of a circle having a diameter greater than the diameter of said dish, and (2) having said horizontally extending elongated opening.

\* \* \* \* \*